US012803574B2

(12) United States Patent
Huang

(10) Patent No.: US 12,803,574 B2
(45) Date of Patent: Nov. 17, 2026

(54) SAMPLE-AND-HOLD CIRCUIT AND MULTIPLYING DIGITAL-TO-ANALOG CONVERTER USING SAME

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 131 days.

(21) Appl. No.: 18/941,477

(22) Filed: Nov. 8, 2024

(65) Prior Publication Data

US 2025/0158632 A1 May 15, 2025

(30) Foreign Application Priority Data

Nov. 15, 2023 (TW) ................................ 112144147

(51) Int. Cl.
*H03M 1/12* (2006.01)
*H03M 1/72* (2006.01)

(52) U.S. Cl.
CPC .................................... *H03M 1/72* (2013.01)

(58) Field of Classification Search
CPC ............ H03M 1/72; H03M 1/68; H03M 1/66; H03M 1/00
USPC ......................... 341/120, 155, 144, 122, 150
See application file for complete search history.

(56) References Cited

U.S. PATENT DOCUMENTS 7,319,419 B1 * 1/2008 Lash .................. H03M 1/0607 341/118
7,924,206 B2 4/2011 Sano
9,755,582 B2 9/2017 Lin
2007/0090984 A1 4/2007 Lu
2016/0329881 A1 * 11/2016 Matsuno .................. H03F 3/24
2019/0296756 A1 * 9/2019 Ali ...................... H03F 3/45237
2024/0283456 A1 8/2024 Huang
2025/0158630 A1 * 5/2025 Huang .................... H03F 3/005

FOREIGN PATENT DOCUMENTS

EP 1917719 B1 2/2012

OTHER PUBLICATIONS

OA letter of a counterpart TW application (appl. No. 112144147) mailed on Sep. 5, 2024.

(Continued)

*Primary Examiner* — Peguy Jean Pierre
(74) *Attorney, Agent, or Firm* — WPAT, PC

(57) ABSTRACT

A sample-and-hold circuit has first and second input terminals, and first and second output terminals. The first input terminal receives a first input signal, and the second input terminal receives a second input signal. The sample-and-hold circuit includes an operational amplifier, first and second switched capacitor (SC) circuits, and a level shifting circuit. The operational amplifier has first and second input nodes and first and second output nodes. The first SC circuit is coupled to the first input terminal, the first output terminal, and the first input node. The second SC circuit is coupled to the second input terminal, the second output terminal, and the second input node. The level shifting circuit is used to level shift the voltage at the first output node and the voltage at the second output node according to at least the first input signal and the second input signal.

17 Claims, 14 Drawing Sheets

(56) References Cited

OTHER PUBLICATIONS

Musah et al., "Correlated level shifting technique with cross-coupled gain-enhancement capacitors", Jun. 18, 2009 vol. 45, Electronics Letters.
Gregoire et al., "An Over-60 dB True Rail-to-Rail Performance Using Correlated Level Shifting and an Opamp With Only 30 dB Loop Gain", Dec. 12, 2008, IEEE Journal of Solid-State Circuits.

* cited by examiner

SAMPLE-AND-HOLD CIRCUIT AND MULTIPLYING DIGITAL-TO-ANALOG CONVERTER USING SAME

BACKGROUND OF THE INVENTION

1. Field of the Invention

The present invention generally relates to a sample-and-hold circuit, and, more particularly, to a sample-and-hold circuit having a correlated level shifting (CLS) function and a multiplying digital-to-analog converter (MDAC) using the sample-and-hold circuit.

2. Description of Related Art

Reference is made to FIG. 1A, which is a circuit diagram of a correlated level shifting (CLS) switched capacitor (SC) circuit. The circuit in FIG. 1A includes an operational amplifier 110, a capacitor C1, a capacitor C2, a capacitor C3, a capacitor C4, a switch SW1, a switch SW2, a switch SW3, a switch SW4, and a switch SW5. The CLS circuit 120 includes the capacitor C3, the switch SW4, and the switch SW5.

FIG. 1B shows three clocks, namely the clock CLK1, the clock CLKe, and the clock CLK2. The circuit in FIG. 1A operates according to these three clocks. To be more specific, when the sampling phase Φs ends, the switch SW1 changes from conducting to non-conducting, the switch SW2 switches from the input signal Vin to the reference voltage (e.g., ground), and the switch SW3 switches from the input signal Vin to the capacitor C3 and the capacitor C4. During the estimation phase Φe, the switch SW4 is switched to the reference voltage, and the switch SW5 is turned on. During the amplification phase Φh, the switch SW4 is switched to the operational amplifier 110, and the switch SW5 is turned off.

Continuing the previous paragraph, during the estimation phase Φe, the capacitor C3 and the capacitor C4 are charged to the output voltage Vo of the operational amplifier 110. During the amplification phase Φh, the voltage at the output terminal of the operational amplifier 110 is level shifted so that the alternating current (AC) signal is 0.

By using the CLS technique, the output swing of the operational amplifier 110 can be effectively reduced; as a result, the gain of the operational amplifier 110 can be reduced, thereby reducing the power consumption and area of the operational amplifier 110. However, the circuit in FIG. 1A requires three clocks, which poses implementation challenges and hinders the improvement of circuit speed. In addition, when the CLS technique is applied to the multiplying digital-to-analog converter (MDAC) of a pipeline analog-to-digital converter (pipeline ADC, also known as pipelined ADC), an additional clock CLK3 is required (as shown in FIG. 2, for controlling the sub-ADC), which also increases the implementation difficulty and decreases the circuit speed.

SUMMARY OF THE INVENTION

In view of the issues of the prior art, an object of the present invention is to provide a sample-and-hold circuit and a multiplying digital-to-analog converter (MDAC) using the same, so as to make an improvement to the prior art.

According to one aspect of the present invention, a sample-and-hold circuit is provided. The sample-and-hold circuit has a first input terminal, a second input terminal, a first output terminal, and a second output terminal. The first input terminal receives a first input signal. The second input terminal receives a second input signal. The sample-and-hold circuit includes an operational amplifier, a first switched capacitor (SC) circuit, a second SC circuit, and a level shifting circuit. The operational amplifier has a first input node, a second input node, a first output node, and a second output node. The first SC circuit is coupled to the first input terminal, the first output terminal, and the first input node. The second SC circuit is coupled to the second input terminal, the second output terminal, and the second input node. The level shifting circuit is coupled to the first output node, the first output terminal, the second output node, and the second output terminal and configured to level shift a voltage at the first output node and a voltage at the second output node according to at least the first input signal and the second input signal.

According to another aspect of the present invention, a multiplying digital-to-analog converter (MDAC) is provided. The MDAC has a first input terminal, a second input terminal, a third input terminal, a fourth input terminal, a first output terminal, and a second output terminal. The first input terminal receives a first input signal. The second input terminal receives a second input signal. The third input terminal receives the second input signal. The fourth input terminal receives the first input signal. The MDAC includes an operational amplifier, a first SC circuit, a second SC circuit, a level shifting circuit, a first load capacitor, a second load capacitor, a first switch, a second switch, an analog-to-digital converter (ADC), and a selection circuit. The operational amplifier has a first input node, a second input node, a first output node, and a second output node. The first SC circuit is coupled to the first input terminal, the third input terminal, the first output terminal, and the first input node. The second SC circuit is coupled to the second input terminal, the fourth input terminal, the second output terminal, and the second input node. The level shifting circuit is coupled to the first output node, the first output terminal, the second output node, and the second output terminal and configured to level shift a voltage at the first output node and a voltage at the second output node. The first load capacitor has a first terminal and a second terminal. The first terminal is electrically connected to the first output terminal. The second load capacitor has a third terminal and a fourth terminal. The third terminal is electrically connected to the second output terminal. The first switch is coupled to the second terminal and receives a first reference voltage. The second switch is coupled to the fourth terminal and receives a second reference voltage. The ADC is configured to generate a selection signal according to the first input signal and the second input signal. The selection circuit is coupled to the ADC and configured to determine the first reference voltage and the second reference voltage from a plurality of preset voltages according to the selection signal.

The technical means embodied in the embodiments of the present invention can solve at least one of the problems of the prior art. Therefore, compared to the prior art, the present invention is easier to design and improves the circuit speed.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a sample-and-hold circuit and a multiplying digital-to-analog converter (MDAC). On account of that some or all elements of the sample-and-hold circuit and the MDAC could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In the following description, signals are active-high, which means that signals are active at high levels and inactive at low levels, and that asserting/de-asserting a signal means setting the signal high/low. This is for the purpose of explanation, not for limiting the scope of the invention. In other words, in an alternative implementation, signals can be active-low, which means that signals are active at low levels and inactive at high levels, and that asserting/de-asserting a signal means setting the signal low/high. A level transition or a logic level transition means that a signal changes from an asserted (active) state to a de-asserted (inactive) state, or from a de-asserted (inactive) state to an asserted (active) state.

Figure 3:
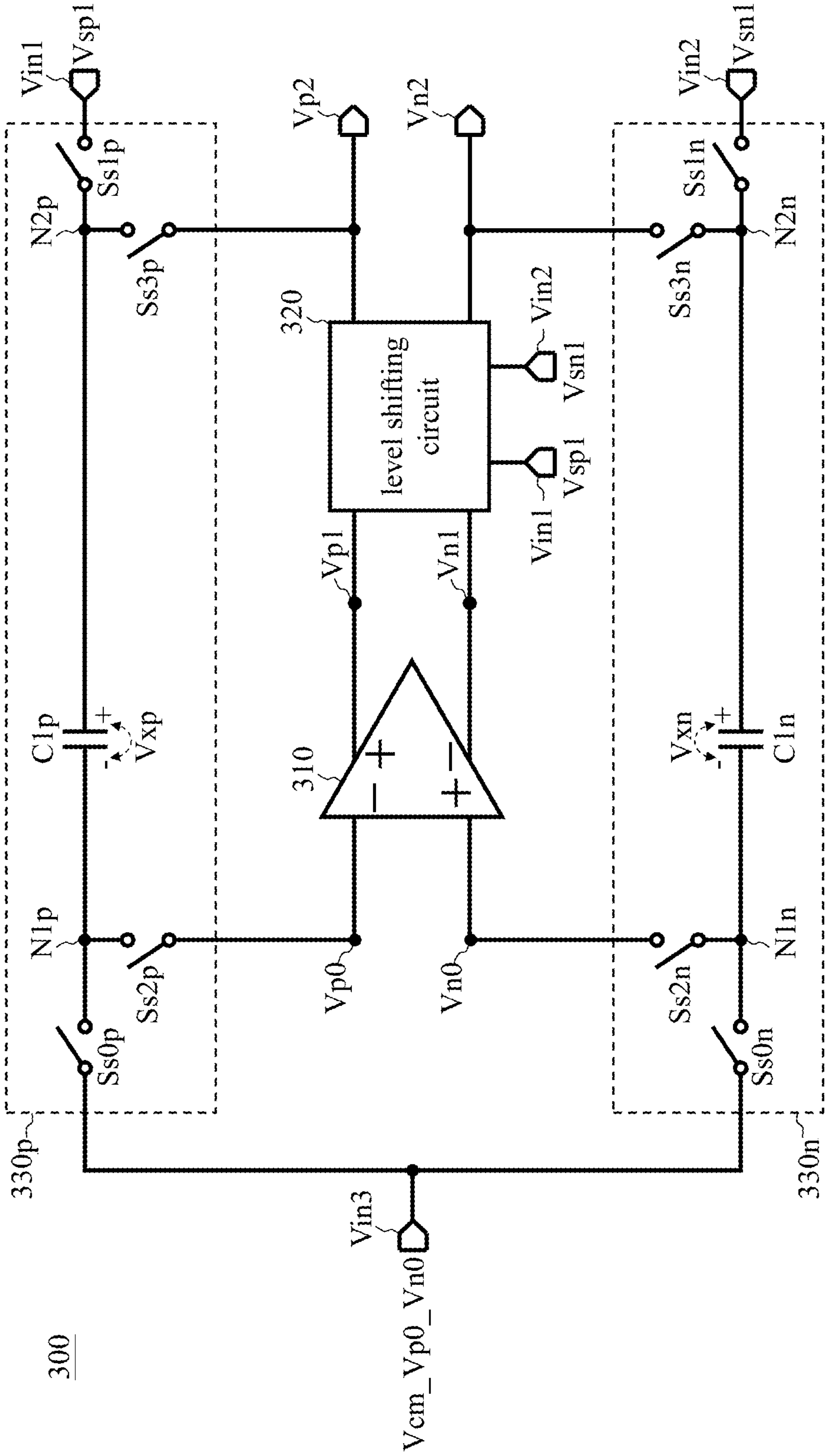
FIG. 3 is the circuit diagram of a sample-and-hold circuit according to an embodiment of the present invention.

Reference is made to FIG. 3, which is a circuit diagram of a sample-and-hold circuit according to an embodiment of the present invention. The sample-and-hold circuit 300 has an input terminal Vin1, an input terminal Vin2, an input terminal Vin3, an output terminal Vp2, and an output terminal Vn2, and includes an operational amplifier 310, a level shifting circuit 320, a switched capacitor (SC) circuit 330*p*, and an SC circuit 330*n*. The SC circuit 330*p* includes a capacitor C1*p*, a switch Ss0*p*, a switch Ss1*p*, a switch Ss2*p*, and a switch Ss3*p*. The SC circuit 330*n* includes a capacitor C1*n*, a switch Ss0*n*, a switch Ss1*n*, a switch Ss2*n*, and a switch Ss3*n*.

The input signal Vsp1 and the input signal Vsn1 are inputted to the sample-and-hold circuit 300 via the input terminal Vin1 and the input terminal Vin2, respectively. The input signal Vsp1 (=Vdc+dV1) and the input signal Vsn1 (=Vdc−dV1) may be a differential signal pair, where Vdc is the common-mode voltage of the two, and dV1 is the signal component.

The input terminal Vin3 receives the direct current (DC) voltage Vcm_Vp0_Vn0. The DC voltage Vcm_Vp0_Vn0 may be the input common-mode voltage of the operational amplifier 310 (i.e., the common-mode voltage of the input node Vp0 and the input node Vn0, for example, it may be a DC voltage that does not saturate the operational amplifier 310).

The SC circuit 330*p* is coupled or electrically connected to the input terminal Vin1, the input terminal Vin3, the output terminal Vp2, and the input node Vp0. The SC circuit 330*n* is coupled or electrically connected to the input terminal Vin2, the input terminal Vin3, the output terminal Vn2, and the input node Vn0.

The two terminals of the capacitor C1*p* (capacitor C1*n*) are the node N1*p* (node N1*n*) and the node N2*p* (node N2*n*), respectively.

One terminal of the switch Ss0*p* (switch Ss0*n*) is coupled or electrically connected to the input terminal Vin3 (i.e., receiving the DC voltage Vcm_Vp0_Vn0); the other terminal of the switch Ss0*p* (switch Ss0*n*) is coupled or electrically connected to the node N1*p* (node N1*n*).

One terminal of the switch Ss1*p* (switch Ss1*n*) is coupled or electrically connected to the input terminal Vin1 (input terminal Vin2) (i.e., receiving the input signal Vsp1 (input signal Vsn1)); the other terminal of the switch Ss1*p* (switch Ss1*n*) is coupled or electrically connected to the node N2*p* (node N2*n*).

One terminal of the switch Ss2*p* (switch Ss2*n*) is coupled or electrically connected to the node N1*p* (node N1*n*); the other terminal of the switch Ss2*p* (switch Ss2*n*) is coupled or electrically connected to the input terminal of the operational amplifier 310 (more specifically, the input node Vp0 (input node Vn0)). The input node Vp0 and the input node Vn0 are the inverting input terminal and the non-inverting input terminal of the operational amplifier 310, respectively.

One terminal of the switch Ss3*p* (switch Ss3*n*) is coupled or electrically connected to the node N2*p* (node N2*n*); the other terminal of the switch Ss3*p* (switch Ss3*n*) is coupled or electrically connected to the output terminal Vp2 (output terminal Vn2).

The level shifting circuit 320 is coupled or electrically connected to the output node Vp1, the output node Vn1, the output terminal Vp2, the output terminal Vn2, the input terminal Vin1 (for receiving the input signal Vsp1), and the input terminal Vin2 (for receiving the input signal Vsn1). The output node Vp1 and the output node Vn1 are the non-inverting output terminal and the inverting output terminal of the operational amplifier 310, respectively. The level shifting circuit 320 level shifts the voltage at the output node Vp1 and the voltage at the output node Vn1 according to at least the input signal Vsp1 and the input signal Vsn1.

Figure 4:
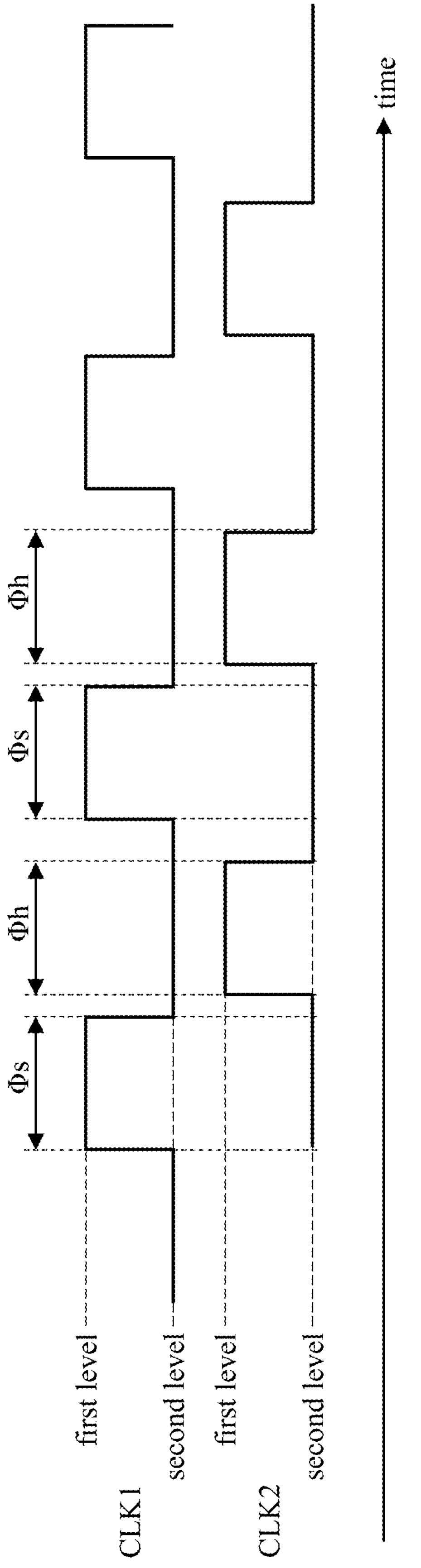
FIG. 4 shows the waveform of clocks according to the present invention.

Reference is made to FIG. 4, which shows the waveform of the clocks according to the present invention. The sample-and-hold circuit 300 operates according to the clock CLK1 and the clock CLK2.

During the sampling phase Φs (i.e., when the clock CLK1 is at the first level (e.g., high level) and the clock CLK2 is at the second level (e.g., low level)), the switch Ss0*p*, the switch Ss1*p*, the switch Ss0*n*, and the switch Ss1*n* are turned on, and the switch Ss2*p*, the switch Ss3*p*, the switch Ss2*n*, and the switch Ss3*n* are turned off, so that the capacitor C1*p* and the capacitor C1*n* sample the input signal Vsp1 and the input signal Vsn1, respectively. After the sampling phase Φs ends, the voltage Vxp across the capacitor C1*p* and the voltage Vxn across the capacitor C1*n* are shown in Equation (1) and Equation (2), respectively.

$$Vxp = Vdc + dV1 - \text{Vcm\_Vp0\_Vn0} \quad (1)$$

$$Vxn = Vdc - dV1 - \text{Vcm\_Vp0\_Vn0}$$

During the amplification phase Φh (i.e., when the clock CLK1 is at the second level and the clock CLK2 is at the first level), the switches Ss0*p*, Ss1*p*, Ss0*n*, and Ss1*n* are turned off, and the switches Ss2*p*, Ss3*p*, Ss2*n*, and Ss3*n* are turned on, so that the voltages maintained at the output terminals Vp2 and Vn2 are as shown in Equations (3) and (4), respectively.

$$Vp2 = Vp0 + Vxp = (\text{Vcm\_Vp0\_Vn0} + dV2) + (Vdc + dV1 - \text{Vcm\_Vp0\_Vn0}) = Vdc + dV1 + dV2 \quad (3)$$

$$Vn2 = Vn0 + Vxn = (\text{Vcm\_Vp0\_Vn0} - dV2) + (Vdc - dV1 - \text{Vcm\_Vp0\_Vn0}) = Vdc - dV1 - dV2 \quad (4)$$

where dV2 is the signal component of the input signal of the operational amplifier 310.

Figure 5:
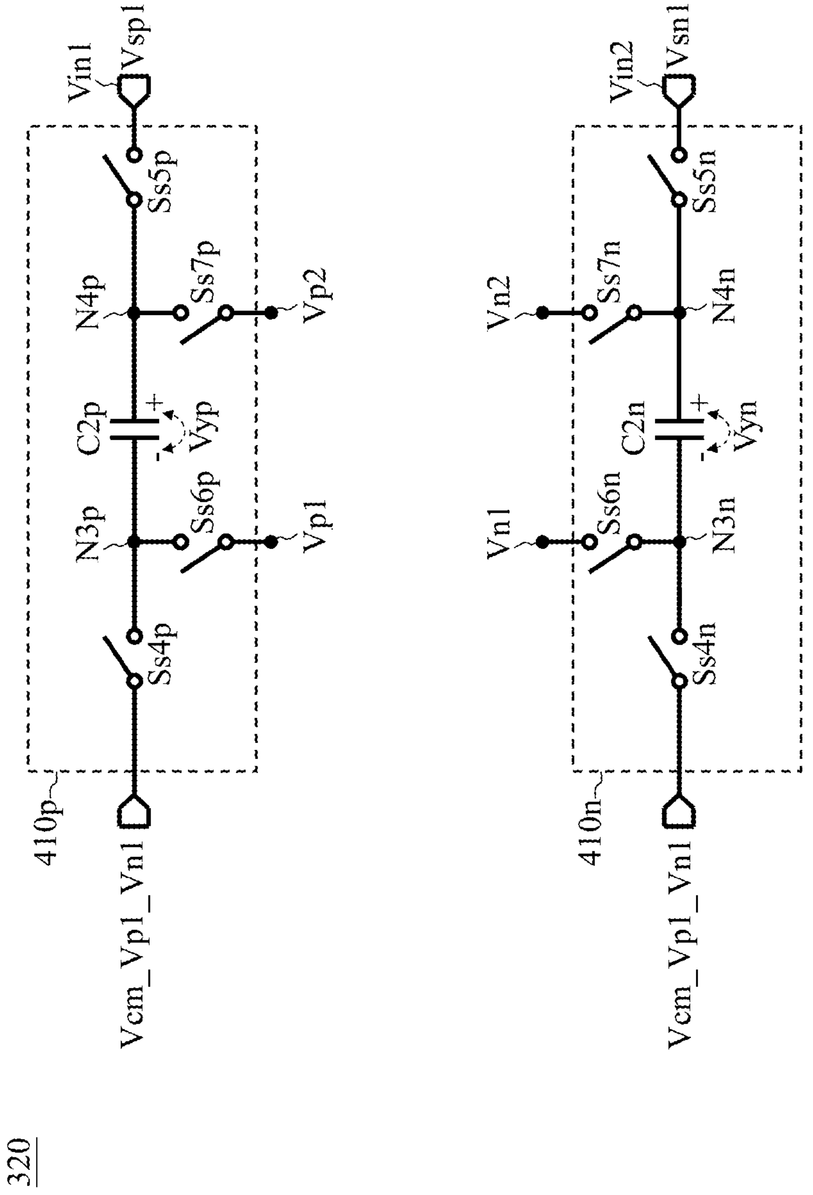
FIG. 5 is the circuit diagram of the level shifting circuit of FIG. 3 according to an embodiment.

Reference is made to FIG. 5, which is the circuit diagram of the level shifting circuit 320 according to an embodiment of the present invention. The level shifting circuit 320 includes an SC circuit 410*p* and an SC circuit 410*n*. The SC circuit 410*p* (SC circuit 410*n*) includes a capacitor C2*p* (capacitor C2*n*), a switch Ss4*p* (switch Ss4*n*), a switch Ss5*p* (switch Ss5*n*), a switch Ss6*p* (switch Ss0*n*), and a switch Ss7*p* (switch Ss7*n*).

The two terminals of the capacitor C2*p* (capacitor C2*n*) are the node N3*p* (node N3*n*) and the node N4*p* (node N4*n*), respectively.

One terminal of the switch Ss4*p* (switch Ss4*n*) receives the DC voltage Vcm_Vp1_Vn1; the other terminal of the switch Ss4*p* (switch Ss4*n*) is coupled or electrically connected to the node N3*p* (node N3*n*). The DC voltage Vcm_Vp1_Vn1 may be the output common-mode voltage of the operational amplifier 310 (i.e., the common-mode voltage of the output node Vp1 and the output node Vn1, for example, it may be a DC voltage that does not saturate the operational amplifier 310).

One terminal of the switch Ss5*p* (switch Ss5*n*) is coupled or electrically connected to the input terminal Vin1 (input terminal Vin2); the other terminal of the switch Ss5*p* (switch Ss5*n*) is coupled or electrically connected to the node N4*p* (node N4*n*).

One terminal of the switch Ss6*p* (switch Ss0*n*) is coupled or electrically connected to the node N3*p* (node N3*n*); the other terminal of the switch Ss6*p* (switch Ss0*n*) is coupled or electrically connected to the output node Vp1 (output node Vn1).

One terminal of the switch Ss7*p* (switch Ss7*n*) is coupled or electrically connected to the node N4*p* (node N4*n*); the other terminal of the switch Ss7*p* (switch Ss7*n*) is coupled or electrically connected to the output terminal Vp2 (output terminal Vn2).

Reference is made to FIG. 3 to FIG. 5. During the sampling phase Φs, the switch Ss4*p*, the switch Ss5*p*, the switch Ss4*n*, and the switch Ss5*n* are turned on, and the switch Ss6*p*, the switch Ss7*p*, the switch Ss0*n*, and the switch Ss7*n* are turned off, so that the capacitor C2*p* and the capacitor C2*n* sample the input signal Vsp1 and the input signal Vsn1, respectively. After the sampling phase Φs ends, the voltage Vyp across the capacitor C2*p* and the voltage Vyn across the capacitor C2*n* are shown in Equation (5) and Equation (6), respectively.

$$Vyp = Vdc + dV1 - \text{Vcm\_Vp1\_Vn1} \quad (5)$$

$$Vyn = Vdc - dV1 - \text{Vcm\_Vp1\_Vn1} \quad (6)$$

During the amplification phase Φh, the switch Ss4*p*, the switch Ss5*p*, the switch Ss4*n*, and the switch Ss5*n* are turned off, and the switch Ss0*p*, the switch Ss7*p*, the switch Ss0*n*, and the switch Ss7*n* are turned on, so that the capacitor C1*p* and the capacitor C2*p* are connected in series, and the capacitor C1*n* and the capacitor C2*n* are connected in series. Therefore, during the amplification phase Φh, the voltage at the output node Vp1 and the voltage at the output node Vn1 are shown in Equation (7) and Equation (8), respectively (Equation (7) is derived from Equation (3) and Equation (5), and Equation (8) is derived from Equation (4) and Equation (6)).

$$Vp1 = Vp2 - Vyp = (Vdc + dV1 + dV2) - (Vdc + dV1 - \text{Vcm\_Vp1\_Vn1}) = dV2 + \text{Vcm\_Vp1\_Vn1} \quad (7)$$

$$Vn1 = Vn2 - Vyn = (Vdc - dV1 - dV2) - (Vdc - dV1 - \text{Vcm\_Vp1\_Vn1}) = -dV2 + \text{Vcm\_Vp1\_Vn1} \quad (8)$$

It is known from Equation (7) and Equation (8) that the level shift achieved by the level shifting circuit 320 (through the voltage Vyp and the voltage Vyn) ensures that the voltage at the output node Vp1, and the voltage at the output node Vn1 do not contain the signal component dV1 of the input signal Vsp1 and the input signal Vsn1. In addition, in the case of the CLS, because the signal swing at the output terminal of the operational amplifier 310 completely appears in the level shifting circuit 620, the AC signal at the output node Vp1 and the output node Vn1 (i.e., the signal component dV2) is very small. As a result, the output node Vp1 and the output node Vn1 of the operational amplifier 310 basically have only DC components, achieving the CLS effect.

Figure 6:
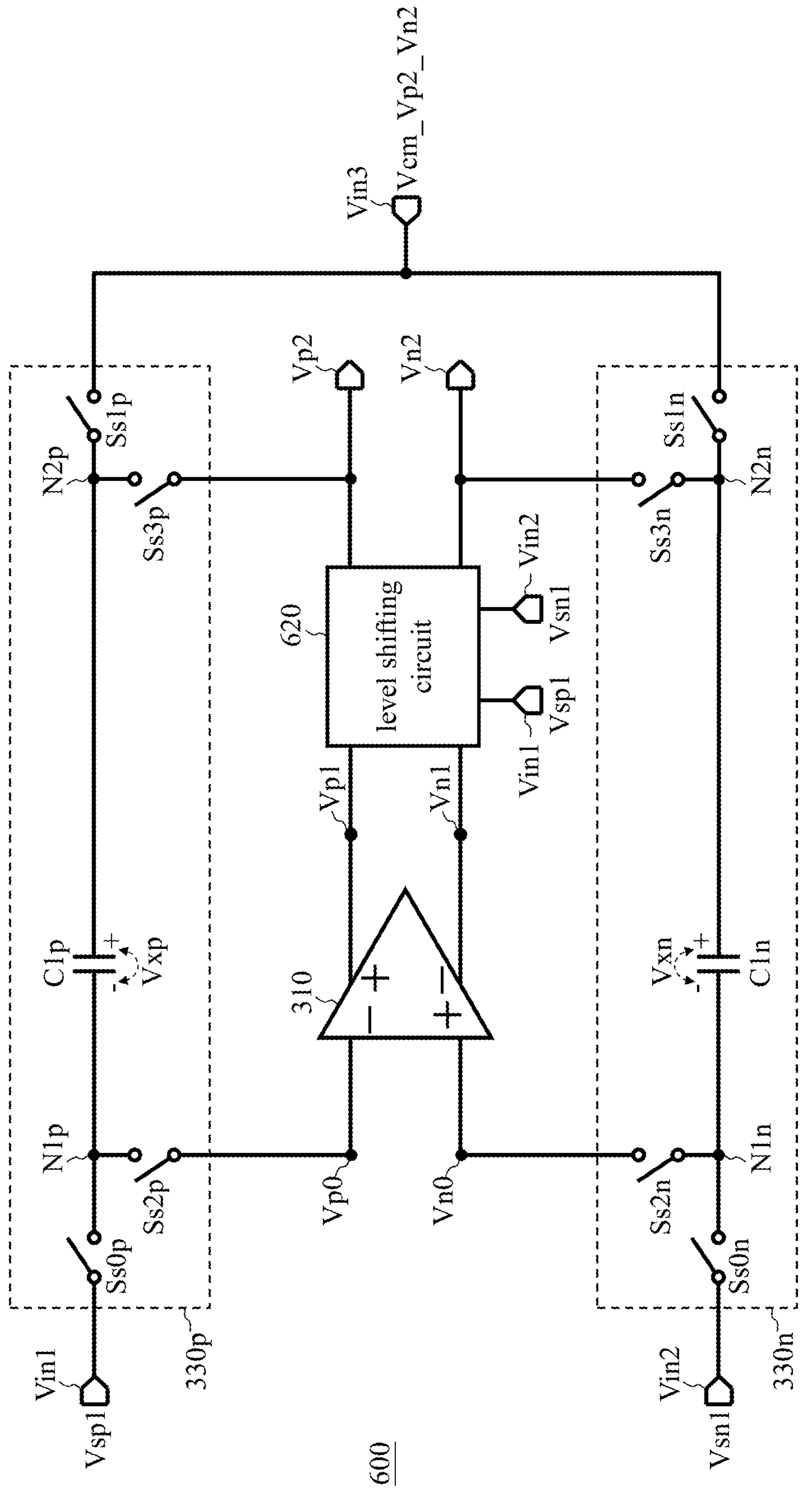
FIG. 6 is the circuit diagram of a sample-and-hold circuit according to another embodiment of the present invention.

Reference is made to FIG. 6, which is a circuit diagram of a sample-and-hold circuit according to another embodiment of the present invention. The sample-and-hold circuit 600 includes a level shifting circuit 620. The sample-and-hold circuit 600 is similar to the sample-and-hold circuit 300, except that: one terminal of the switch Ss0*p* is coupled or electrically connected to the input terminal Vin1, and the input terminal Vin1 receives the input signal Vsp1; one terminal of the switch Ss0*n* is coupled or electrically connected to the input terminal Vin2, and the input terminal Vin2 receives the input signal Vsn1; one terminal of the switch Ss1*p* and one terminal of the switch Ss1*n* are coupled or electrically connected to the input terminal Vin3, and the input terminal Vin3 receives the DC voltage Vcm_Vp2_Vn2; and the level shifting circuit 620 is slightly different from the level shifting circuit 320. The DC voltage Vcm_Vp2_Vn2 may be the common-mode voltage of the output terminal Vp2 and the output terminal Vn2. The level shifting circuit 620 level shifts the voltage at the output node Vp1 and the voltage at the output node Vn1 according to at least the input signal Vsp1 and the input signal Vsn1.

Figure 7:
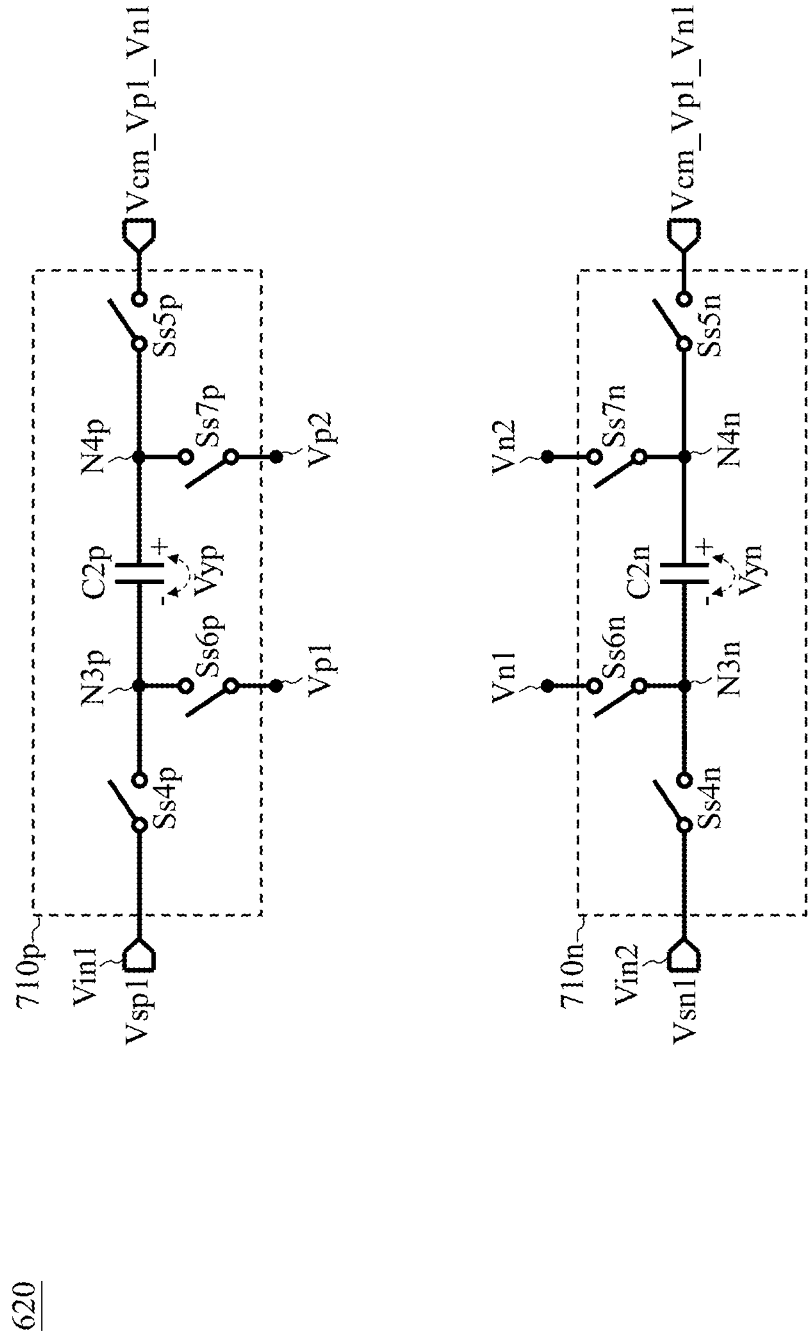
FIG. 7 is the circuit diagram of the level shifting circuit of FIG. 6 according to an embodiment.

Reference is made to FIG. 7, which is a circuit diagram of the level shifting circuit 620 according to an embodiment of the present invention. The level shifting circuit 620 includes an SC circuit 710*p* and an SC circuit 710*n*. The SC circuit 710*p* (SC circuit 710*n*) is similar to the SC circuit 410*p* (SC circuit 410*n*), except that the switch Ss4*p* (switch Ss4*n*) receives the input signal Vsp1 (input signal Vsn1) instead of the DC voltage Vcm_Vp1_Vn1, and the switch Ss5*p* (switch Ss5*n*) receives the DC voltage Vcm_Vp1_Vn1 instead of the input signal Vsp1 (input signal Vsn1).

The circuits in FIG. 6 and FIG. 7 also operate according to the clocks in FIG. 4. As people having ordinary skill in the art can infer the operational details of FIG. 6 and FIG. 7 from the discussion of FIG. 3 to FIG. 5, further elaboration is omitted for brevity.

Figure 8:
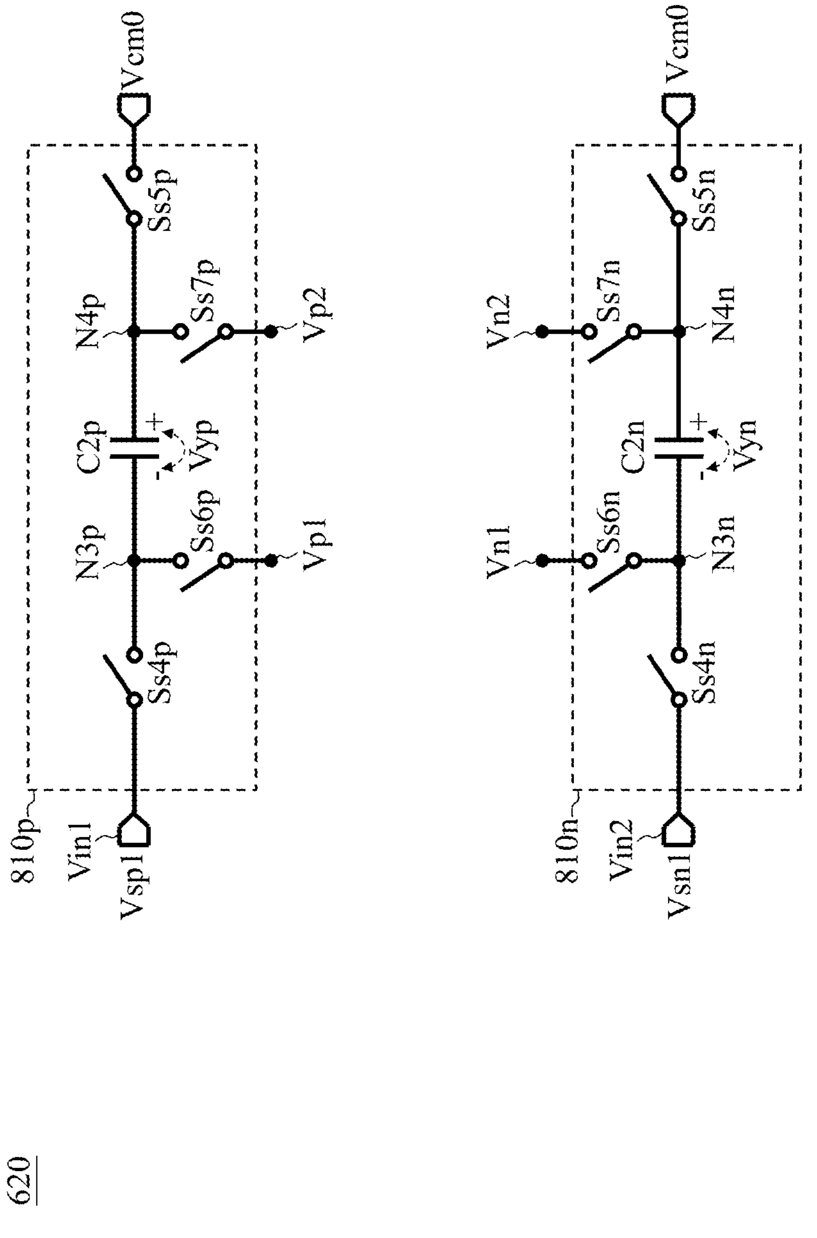
FIG. 8 is the circuit diagram of the level shifting circuit of FIG. 6 according to another embodiment.

Reference is made to FIG. 8, which is a circuit diagram of the level shifting circuit 620 according to another embodiment of the present invention. The level shifting circuit 620 includes an SC circuit 810*p* and an SC circuit 810*n*. The SC circuit 810*p* (SC circuit 810*n*) is similar to the SC circuit 710*p* (SC circuit 710*n*), except that the switch Ss5*p* (switch Ss5*n*) receives the DC voltage Vcm0, instead of the DC voltage Vcm_Vp1_Vn1. The DC voltage Vcm0 may be a DC voltage of any level. The circuit in FIG. 8 has substantially the same effect as the circuit in FIG. 7.

Figure 9:
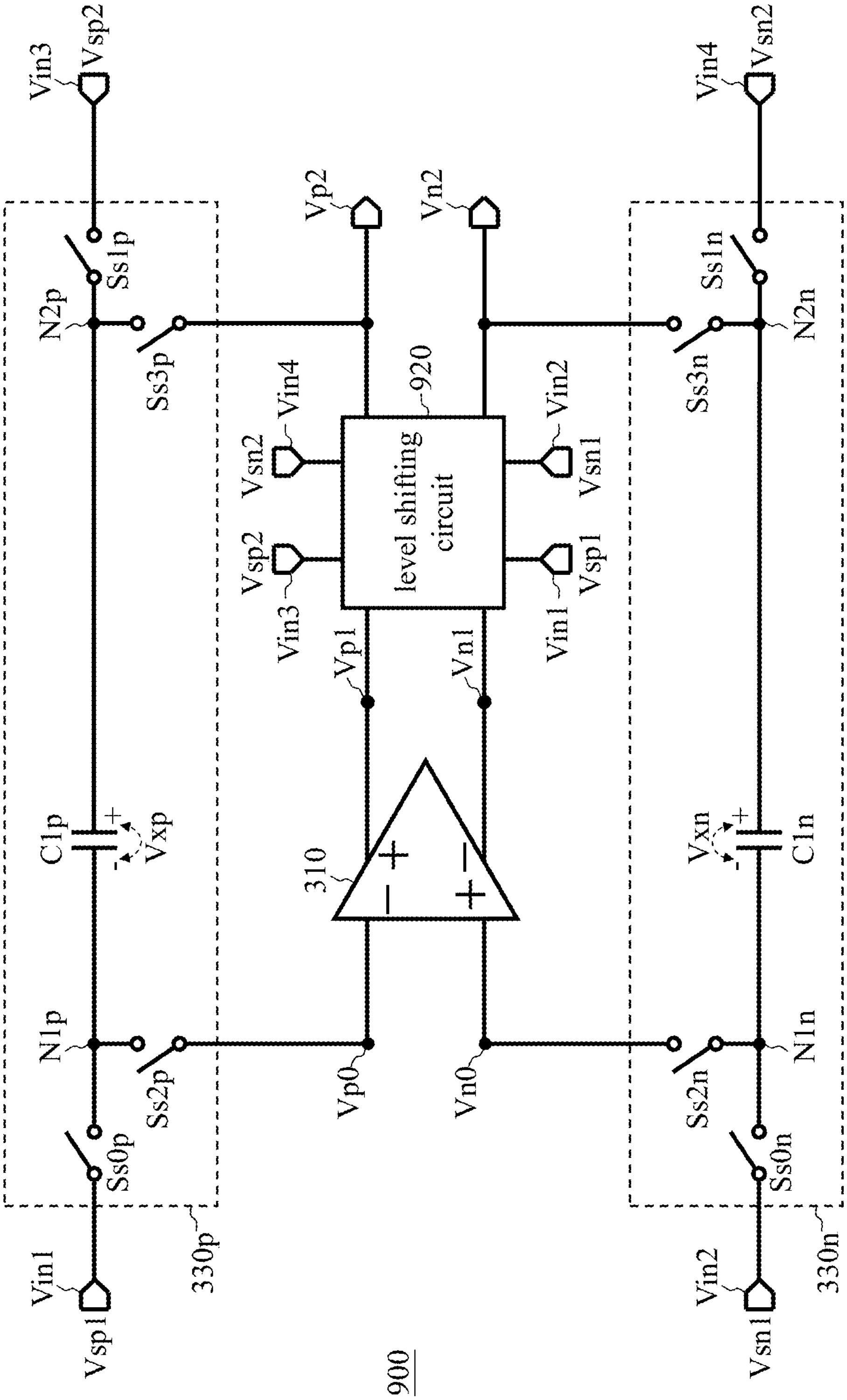
FIG. 9 is the circuit diagram of a sample-and-hold circuit according to another embodiment of the present invention.

Reference is made to FIG. 9, which is a circuit diagram of a sample-and-hold circuit according to another embodiment of the present invention. The sample-and-hold circuit 900 includes a level shifting circuit 920. The sample-and-hold circuit 900 is similar to the sample-and-hold circuit 300, except that: the sample-and-hold circuit 900 includes four input terminals (Vin1, Vin2, Vin3, and Vin4, which receive the input signals Vsp1, Vsn1, Vsp2, and Vsn2, respectively); the SC circuit 330*n* is coupled or electrically connected to the input terminal Vin4 but not electrically connected to the input terminal Vin3; one terminal of the switch Ss0*p* is coupled or electrically connected to the input terminal Vin1; one terminal of the switch Ss0*n* is coupled or electrically connected to the input terminal Vin2; one terminal of the switch Ss1*p* is coupled or electrically connected to the input terminal Vin3; one terminal of the switch Ss1*n* is coupled or electrically connected to the input terminal Vin4; and the level shifting circuit 920 is slightly different from the level shifting circuit 320. The level shifting circuit 920 level shifts the voltage at the output node Vp1 and the voltage at the output node Vn1 according to the input signals Vsp1, Vsn1, Vsp2, and Vsn2.

Figure 10:
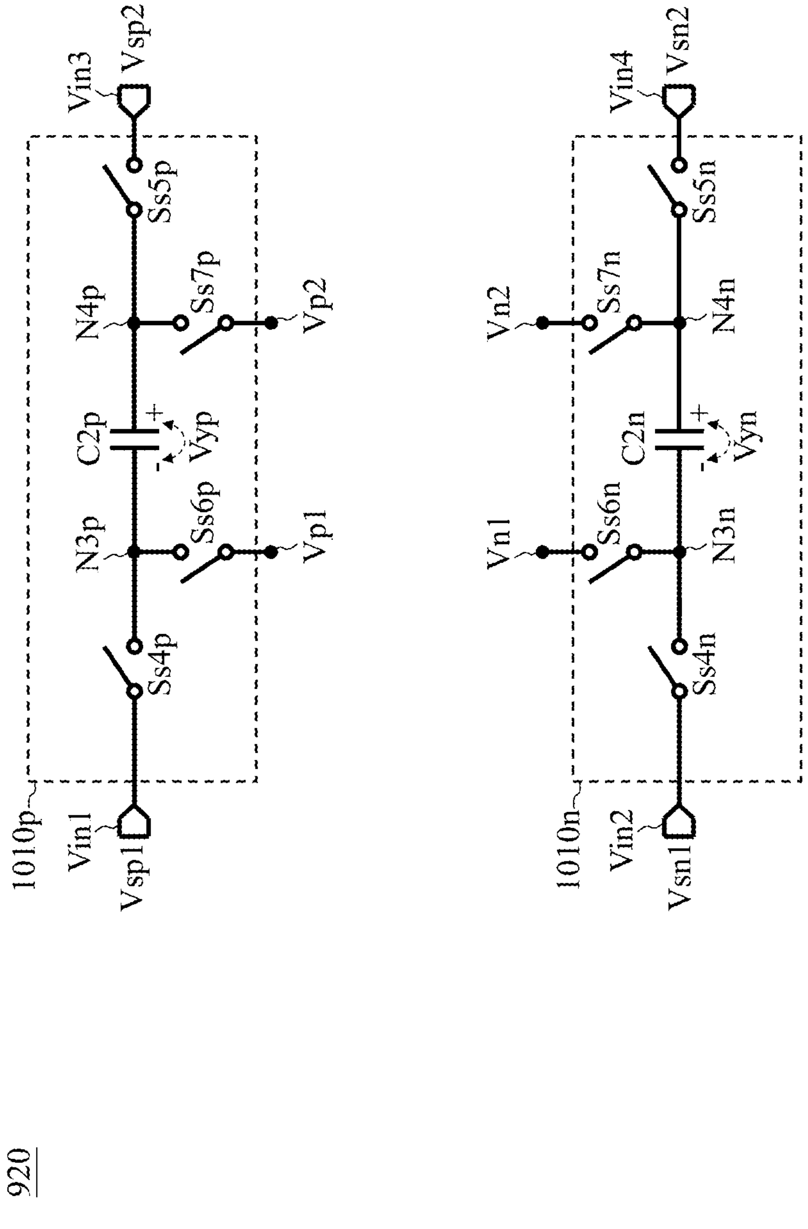
FIG. 10 is the circuit diagram of the level shifting circuit of FIG. 9 according to an embodiment.

Reference is made to FIG. 10, which is a circuit diagram of the level shifting circuit 920 according to an embodiment of the present invention. The level shifting circuit 920 includes an SC circuit 1010*p* and an SC circuit 1010*n*. The SC circuit 1010*p* (SC circuit 1010*n*) is similar to the SC circuit 810*p* (SC circuit 810*n*), except that the switch Ss5*p* (switch Ss5*n*) receives the input signal Vsp2 (input signal Vsn2) instead of the DC voltage Vcm0.

The circuits in FIG. 9 and FIG. 10 also operate according to the clocks in FIG. 4. As people having ordinary skill in the art can infer the operational details of FIG. 9 and FIG. 10 from the discussion of FIG. 3 to FIG. 5, further elaboration is omitted for brevity. The input signal Vsp1 and the input signal Vsn1 may be a pair of differential signals, and the input signal Vsp2 and the input signal Vsn2 may be another pair of differential signals.

In some embodiments, Vsp1=Vsn2+Vcm1, and Vsn1=Vsp2+Vcm1, where Vcm1 is a DC voltage of any level.

In an alternative embodiment, Vsp2=Vsn1, and Vsn2=Vsp1, so that the voltage at the output terminal Vp2 contains 2 times the signal component dV1 (i.e., +2dV1 or −2dV1).

Figure 11:
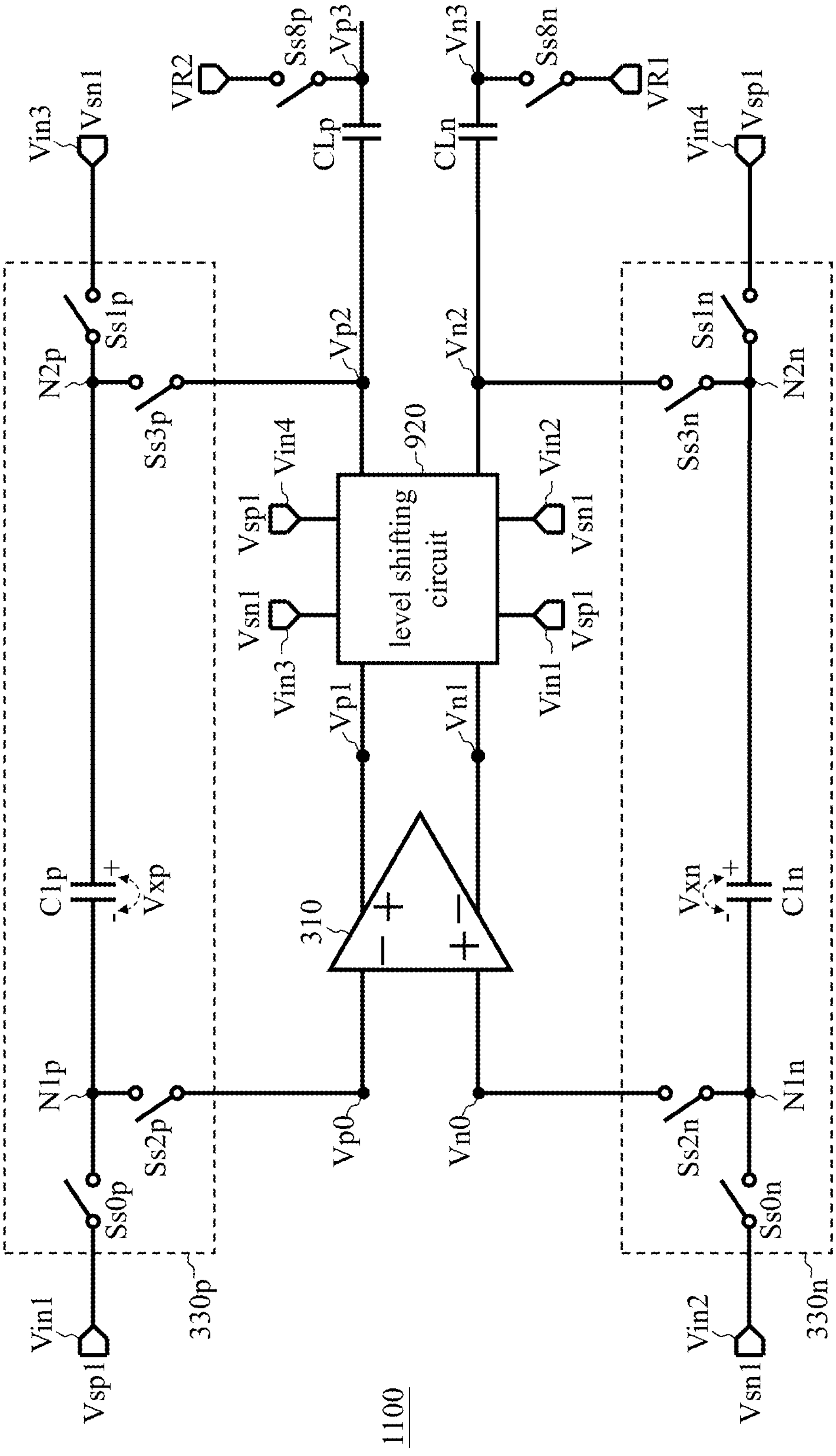
FIG. 11 is the circuit diagram of a sample-and-hold circuit according to another embodiment of the present invention.

Reference is made to FIG. 11, which is a circuit diagram of a sample-and-hold circuit according to another embodiment of the present invention. The sample-and-hold circuit 1100 is similar to the sample-and-hold circuit 900, except that the sample-and-hold circuit 1100 further includes a load capacitor CLp, a load capacitor CLn, a switch Ss8*p*, and a switch Ss8*n*. The two terminals of the load capacitor CLp (load capacitor CLn) are the output terminal Vp2 (output terminal Vn2) and the node Vp3 (node Vn3), respectively. One terminal of the switch Ss8*p* (switch Ss8*n*) is coupled or electrically connected to the node Vp3 (node Vn3); the other terminal of the switch Ss8*p* (switch Ss8*n*) receives the reference voltage VR2 (reference voltage VR1). The signals (or voltages) at the output terminal Vp2 and the output terminal Vn2 are coupled to the next stage circuit (i.e., the circuit that is coupled or electrically connected to the nodes Vp3 and Vn3, not shown) through the load capacitor CLp and the load capacitor CLn, respectively.

Figure 12:
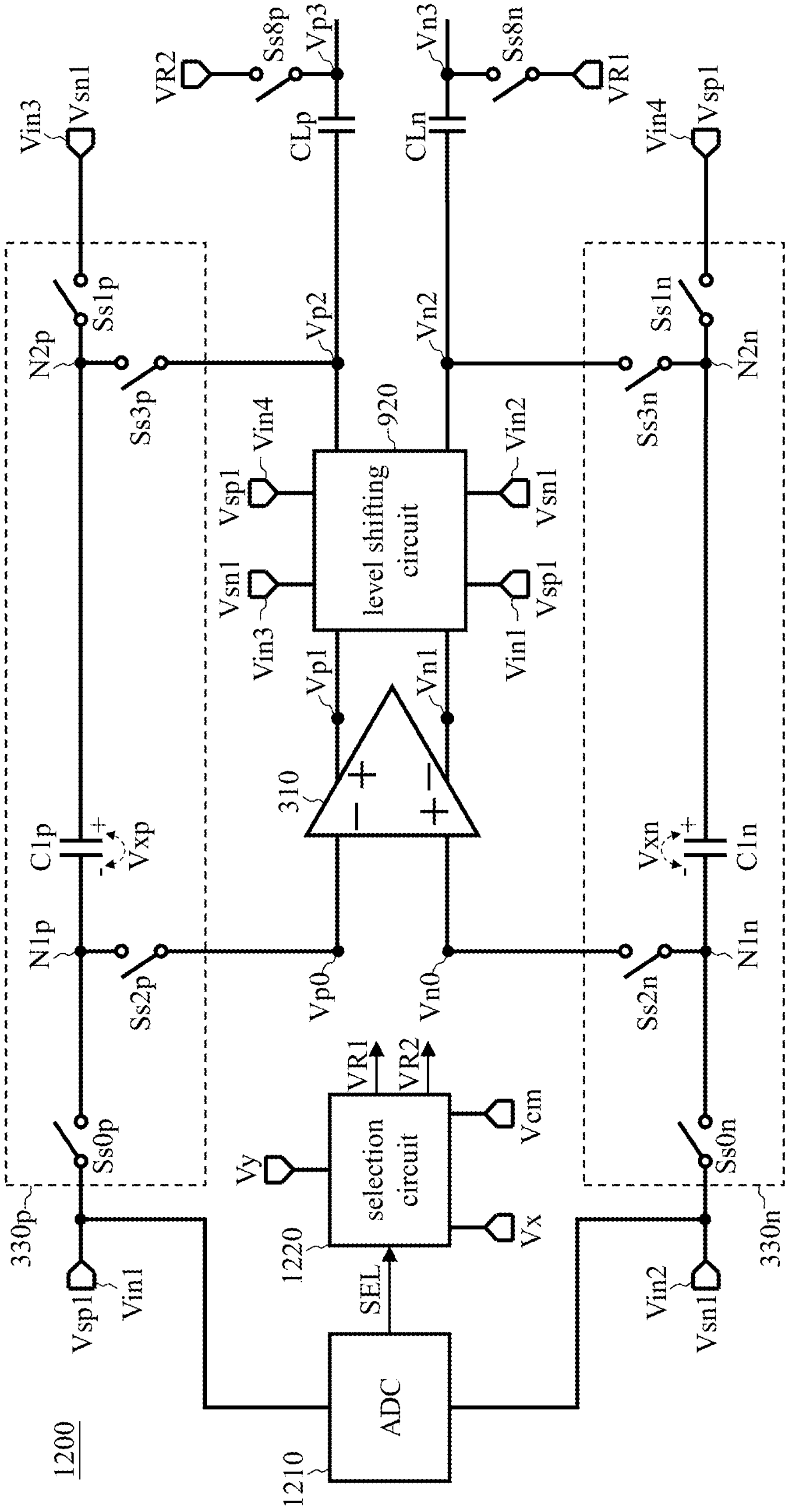
FIG. 12 is the functional block diagram of a multiplying digital-to-analog converter (MDAC) according to an embodiment of the present invention.

The sample-and-hold circuit 1100 of FIG. 11 may be combined with an analog-to-digital converter (ADC) and a selection circuit to implement an MDAC of a pipeline analog-to-digital converter (pipeline ADC, also known as pipelined ADC). Reference is made to FIG. 12, which is a functional block diagram of an MDAC according to an embodiment of the present invention. In comparison with FIG. 11, the MDAC 1200 in FIG. 12 further includes an ADC 1210 and a selection circuit 1220.

The ADC 1210 generates the selection signal SEL according to the input signal Vsp1 and the input signal Vsn1.

The selection circuit 1220 selects one of the preset voltages Vx, the preset voltage Vy, and the preset voltage Vcm as the reference voltage VR1 and/or the reference voltage VR2 according to the selection signal SEL. The preset voltage Vx may be Vcm+Vz, and the preset voltage Vy may be Vcm−Vz, where Vz is a DC voltage. For example, VR1=Vx and VR2=Vy, or VR1=VR2−Vcm. As people having ordinary skill in the art can understand the operating principles of the ADC 1210 and the selection circuit 1220 based on traditional MDACs, further elaboration is omitted for brevity.

The MDAC 1200 in FIG. 12 may correspond to a traditional 1.5-bit MDAC (i.e., the signal component dV1 of the input signal Vsp1 and the input signal Vsn1 is amplified by a factor of 2; in this case, the input signal Vsp2 and the input signal Vsn2 in FIG. 10 are equal to the input signal Vsn1 and the input signal Vsp1, respectively). However, because the reference voltage VR1 and the reference voltage VR2 are applied to the load capacitor CLp and the load capacitor CLn (rather than to the sampling capacitors of the traditional MDAC), and the load capacitor CLp and the load capacitor CLn are relatively small (smaller than the sampling capacitors of the traditional MDAC), the driving capability of the preset voltage Vx, the preset voltage Vy, and the preset voltage Vcm may be relatively small. Consequently, the power consumption of the entire MDAC may be reduced.

Figure 13:
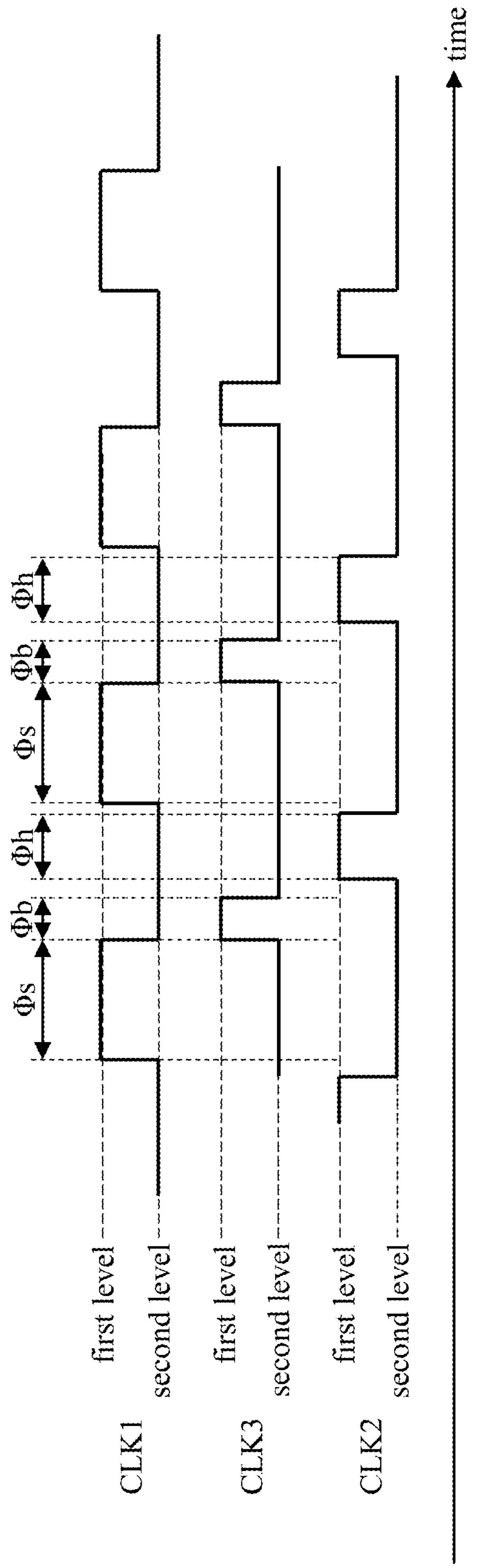
FIG. 13 shows another waveform of clocks according to the present invention.

Reference is made to FIG. 13, which shows another waveform of clocks according to the present invention. The MDAC 1200 in FIG. 12 operates further according to the clock CLK3. In comparison with FIG. 4, FIG. 13 further includes the phase Φb (i.e., when the clock CLK3 is at the first level, and the clock CLK1 and the clock CLK2 are at the second level), and the phase Φb is between the sampling phase Φs and the amplification phase Φh. During the phase Φb, the ADC 1210 generates the selection signal SEL, and the selection circuit 1220 generates the reference voltage VR1 and the reference voltage VR2 according to the selection signal SEL. The switch Ss8*p* and the switch Ss8*n* are turned on in the amplification phase Φh and turned off in the sampling phase Φs and the phase Φb. The clock CLK3 is at the second level during the sampling phase Φs and the amplification phase Φh.

Figure 1A:
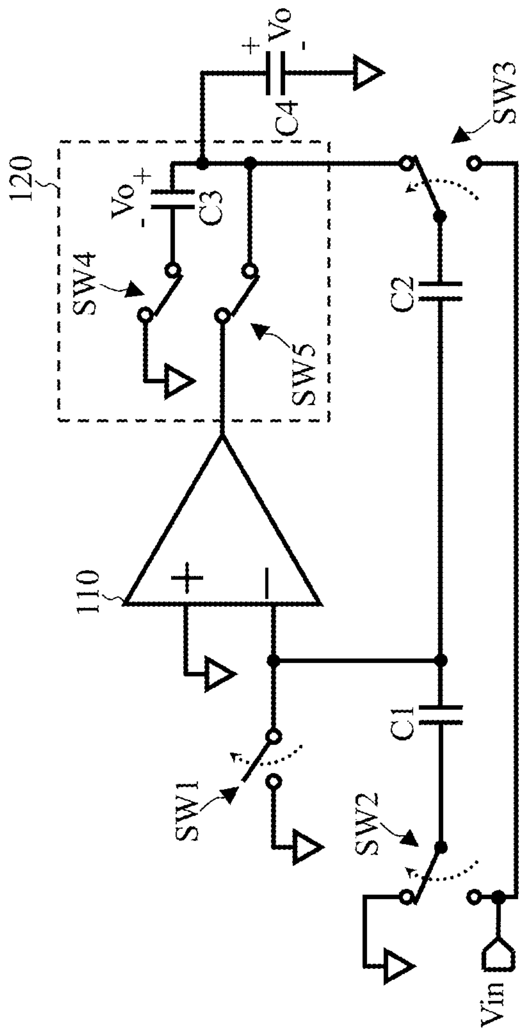
FIG. 1A (prior art)
FIG. 1A is the circuit diagram of a conventional correlated level shifting (CLS) switched capacitor (SC) circuit.
Figure 1B:
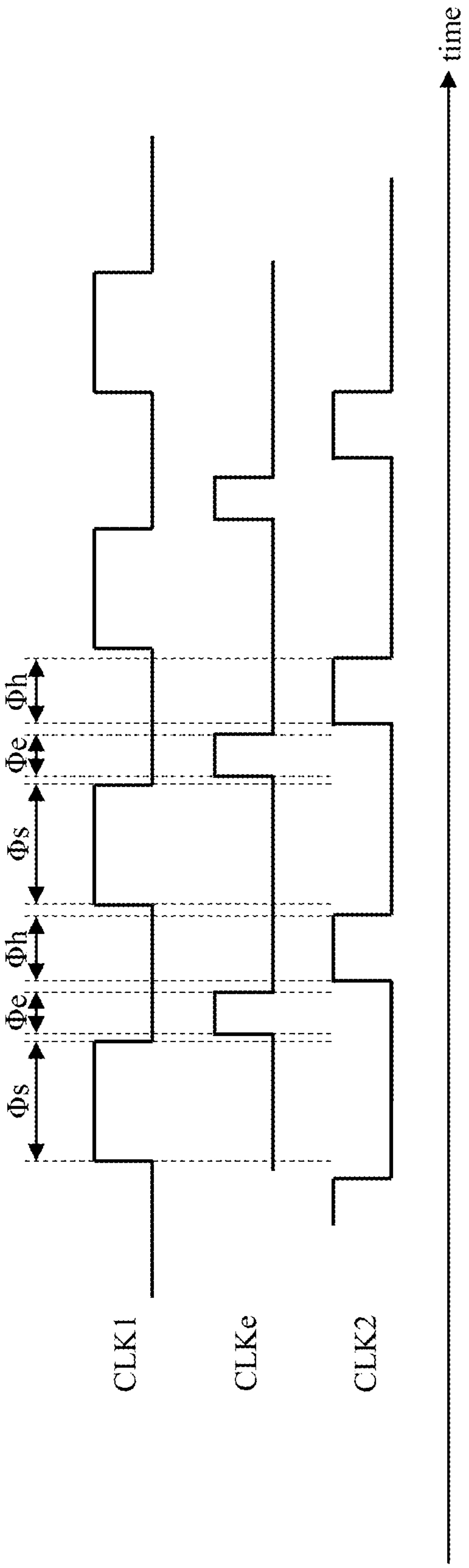
FIG. 1B (prior art)
FIG. 1B shows the waveform of multiple clocks.
Figure 2:
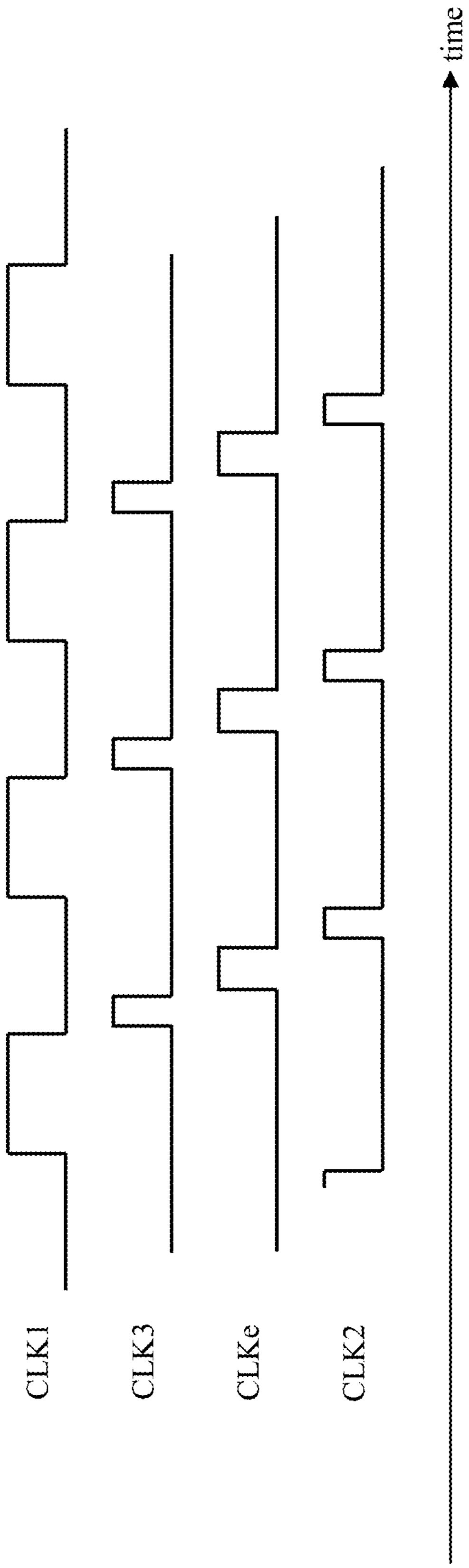
FIG. 2 (prior art)
FIG. 2 shows the waveform of multiple clocks.

Reference is made to FIG. 2 and FIG. 13. Because the MDAC 1200 uses the level shifting circuit 920 of the present invention, the estimation phase Φe in the prior art is not required, which greatly simplifies the circuit design and improves the circuit speed.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A sample-and-hold circuit having a first input terminal, a second input terminal, a first output terminal, and a second output terminal, the first input terminal receiving a first input signal, the second input terminal receiving a second input signal, the sample-and-hold circuit comprising:
- an operational amplifier having a first input node, a second input node, a first output node, and a second output node;
- a first switched capacitor (SC) circuit coupled to the first input terminal, the first output terminal, and the first input node;
- a second SC circuit coupled to the second input terminal, the second output terminal, and the second input node; and
- a level shifting circuit coupled to the first output node, the first output terminal, the second output node, and the second output terminal and configured to level shift a voltage at the first output node and a voltage at the second output node according to at least the first input signal and the second input signal;
- wherein the first SC circuit comprises:
  - a first capacitor having a first terminal and a second terminal;
  - a first switch coupled to the first terminal;
  - a third switch coupled to the second terminal;
  - a fifth switch coupled between the first terminal and the first input node; and
  - a seventh switch coupled between the second terminal and the first output terminal; and
- the second SC circuit comprises:
  - a second capacitor having a third terminal and a fourth terminal;
  - a second switch coupled to the third terminal;
  - a fourth switch coupled to the fourth terminal;
  - a sixth switch coupled between the third terminal and the second input node; and
  - an eighth switch coupled between the fourth terminal and the second output terminal.

2. The sample-and-hold circuit of claim 1, wherein the first switch and the second switch receive a first direct current (DC) voltage, the third switch is further coupled to the first input terminal, the fourth switch is further coupled to the second input terminal, the level shifting circuit comprising:
- a third capacitor having a fifth terminal and a sixth terminal;
- a fourth capacitor having a seventh terminal and an eighth terminal;
- a ninth switch coupled to the fifth terminal and receiving a second DC voltage;
- a tenth switch coupled to the seventh terminal and receiving the second DC voltage;
- an eleventh switch coupled between the sixth terminal and the first input terminal;
- a twelfth switch coupled between the eighth terminal and the second input terminal;
- a thirteenth switch coupled between the fifth terminal and the first output node;
- a fourteenth switch coupled between the seventh terminal and the second output node;
- a fifteenth switch coupled between the sixth terminal and the first output terminal; and
- a sixteenth switch coupled between the eighth terminal and the second output terminal.

3. The sample-and-hold circuit of claim 2, wherein the sample-and-hold circuit operates according to a first clock and a second clock, when the first clock is at a first level and the second clock is at a second level, the first switch, the second switch, the third switch, the fourth switch, the ninth switch, the tenth switch, the eleventh switch, and the twelfth switch are turned on, and the fifth switch, the sixth switch, the seventh switch, the eighth switch, the thirteenth switch, the fourteenth switch, the fifteenth switch, and the sixteenth switch are turned off; when the first clock is at the second level and the second clock is at the first level, the first switch, the second switch, the third switch, the fourth switch, the ninth switch, the tenth switch, the eleventh switch, and the twelfth switch are turned off, and the fifth switch, the sixth switch, the seventh switch, the eighth switch, the thirteenth switch, the fourteenth switch, the fifteenth switch, and the sixteenth switch are turned on.

4. The sample-and-hold circuit of claim 1, wherein the first switch is further coupled to the first input terminal, the second switch is further coupled to the second input terminal, the third switch and the fourth switch receive a first direct current (DC) voltage, the level shifting circuit comprising:
- a third capacitor having a fifth terminal and a sixth terminal;
- a fourth capacitor having a seventh terminal and an eighth terminal;
- a ninth switch coupled between the fifth terminal and the first input terminal;

a tenth switch coupled between the seventh terminal and the second input terminal;

an eleventh switch coupled to the sixth terminal and receiving a second DC voltage;

a twelfth switch coupled to the eighth terminal and receiving the second DC voltage;

a thirteenth switch coupled between the fifth terminal and the first output node;

a fourteenth switch coupled between the seventh terminal and the second output node;

a fifteenth switch coupled between the sixth terminal and the first output terminal; and a sixteenth switch coupled between the eighth terminal and the second output terminal.

5. The sample-and-hold circuit of claim 4, wherein the second DC voltage is a common-mode voltage of the first output node and the second output node.

6. The sample-and-hold circuit of claim 5, wherein the sample-and-hold circuit operates according to a first clock and a second clock, when the first clock is at a first level and the second clock is at a second level, the first switch, the second switch, the third switch, the fourth switch, the ninth switch, the tenth switch, the eleventh switch, and the twelfth switch are turned on, and the fifth switch, the sixth switch, the seventh switch, the eighth switch, the thirteenth switch, the fourteenth switch, the fifteenth switch, and the sixteenth switch are turned off; when the first clock is at the second level and the second clock is at the first level, the first switch, the second switch, the third switch, the fourth switch, the ninth switch, the tenth switch, the eleventh switch, and the twelfth switch are turned off, and the fifth switch, the sixth switch, the seventh switch, the eighth switch, the thirteenth switch, the fourteenth switch, the fifteenth switch, and the sixteenth switch are turned on.

7. The sample-and-hold circuit of claim 1, wherein the sample-and-hold circuit further comprises a third input terminal and a fourth input terminal, the third input terminal receives a third input signal, the fourth input terminal receives a fourth input signal, the first switch is further coupled to the first input terminal, the second switch is further coupled to the second input terminal, the third switch is further coupled to the third input terminal, the fourth switch is further coupled to the fourth input terminal, the level shifting circuit comprising:

a third capacitor having a fifth terminal and a sixth terminal;

a fourth capacitor having a seventh terminal and an eighth terminal;

a ninth switch coupled between the fifth terminal and the first input terminal;

a tenth switch coupled between the seventh terminal and the second input terminal;

an eleventh switch coupled between the sixth terminal and the third input terminal;

a twelfth switch coupled between the eighth terminal and the fourth input terminal;

a thirteenth switch coupled between the fifth terminal and the first output node;

a fourteenth switch coupled between the seventh terminal and the second output node;

a fifteenth switch coupled between the sixth terminal and the first output terminal; and a sixteenth switch coupled between the eighth terminal and the second output terminal.

8. The sample-and-hold circuit of claim 7, wherein the first input signal and the second input signal are a first differential signal pair, and the third input signal and the fourth input signal are a second differential signal pair.

9. The sample-and-hold circuit of claim 7, wherein the first input signal is the fourth input signal plus a direct current (DC) voltage, and the second input signal is the third input signal plus the DC voltage.

10. The sample-and-hold circuit of claim 7, wherein the third input signal is equal to the second input signal, and the fourth input signal is equal to the first input signal.

11. The sample-and-hold circuit of claim 10 further comprising:

a first load capacitor having a ninth terminal and a tenth terminal, the ninth terminal being electrically connected to the first output terminal;

a second load capacitor having an eleventh terminal and a twelfth terminal, the eleventh terminal being electrically connected to the second output terminal;

a seventeenth switch coupled to the tenth terminal and receiving a first reference voltage; and an eighteenth switch coupled to the twelfth terminal and receiving a second reference voltage.

12. The sample-and-hold circuit of claim 7, wherein the sample-and-hold circuit operates according to a first clock and a second clock, when the first clock is at a first level and the second clock is at a second level, the first switch, the second switch, the third switch, the fourth switch, the ninth switch, the tenth switch, the eleventh switch, and the twelfth switch are turned on, and the fifth switch, the sixth switch, the seventh switch, the eighth switch, the thirteenth switch, the fourteenth switch, the fifteenth switch, and the sixteenth switch are turned off; when the first clock is at the second level and the second clock is at the first level, the first switch, the second switch, the third switch, the fourth switch, the ninth switch, the tenth switch, the eleventh switch, and the twelfth switch are turned off, and the fifth switch, the sixth switch, the seventh switch, the eighth switch, the thirteenth switch, the fourteenth switch, the fifteenth switch, and the sixteenth switch are turned on.

13. The sample-and-hold circuit of claim 1, wherein the sample-and- hold circuit operates according to a first clock and a second clock, when the first clock is at a first level and the second clock is at a second level, the first switch, the second switch, the third switch, and the fourth switch are turned on, and the fifth switch, the sixth switch, the seventh switch, and the eighth switch are turned off; when the first clock is at the second level and the second clock is at the first level, the first switch, the second switch, the third switch, and the fourth switch are turned off, and the fifth switch, the sixth switch, the seventh switch, and the eighth switch are turned on.

14. A multiplying digital-to-analog converter (MDAC) having a first input terminal, a second input terminal, a third input terminal, a fourth input terminal, a first output terminal, and a second output terminal, the first input terminal receiving a first input signal, the second input terminal receiving a second input signal, the third input terminal receiving the second input signal, the fourth input terminal receiving the first input signal, the MDAC comprising:

an operational amplifier having a first input node, a second input node, a first output node, and a second output node;

a first switched capacitor (SC) circuit coupled to the first input terminal, the third input terminal, the first output terminal, and the first input node;

a second SC circuit coupled to the second input terminal, the fourth input terminal, the second output terminal, and the second input node;

a level shifting circuit coupled to the first output node, the first output terminal, the second output node, and the second output terminal and configured to level shift a voltage at the first output node and a voltage at the second output node;

a first load capacitor having a first terminal and a second terminal, the first terminal being electrically connected to the first output terminal;

a second load capacitor having a third terminal and a fourth terminal, the third terminal being electrically connected to the second output terminal;

a first switch coupled to the second terminal and receiving a first reference voltage;

a second switch coupled to the fourth terminal and receiving a second reference voltage;

an analog-to-digital converter (ADC) configured to generate a selection signal according to the first input signal and the second input signal; and a selection circuit coupled to the ADC and configured to determine the first reference voltage and the second reference voltage from a plurality of preset voltages according to the selection signal.

15. The MDAC of claim 14, wherein the first SC circuit comprises:

a first capacitor having a fifth terminal and a sixth terminal;

a third switch coupled between the fifth terminal and the first input terminal;

a fifth switch coupled between the sixth terminal and the third input terminal;

a seventh switch coupled between the fifth terminal and the first input node;

a ninth switch coupled between the sixth terminal and the first output terminal;

the second SC circuit comprises:

a second capacitor having a seventh terminal and an eighth terminal;

a fourth switch coupled between the seventh terminal and the second input terminal;

a sixth switch coupled between the eighth terminal and the fourth input terminal;

an eighth switch coupled between the seventh terminal and the second input node;

a tenth switch coupled between the eighth terminal and the second output terminal.

16. The MDAC of claim 15, wherein the level shifting circuit comprises:

a third capacitor having a ninth terminal and a tenth terminal;

a fourth capacitor having an eleventh terminal and a twelfth terminal;

an eleventh switch coupled between the ninth terminal and the first input terminal;

a twelfth switch coupled between the eleventh terminal and the second input terminal;

a thirteenth switch coupled between the tenth terminal and the third input terminal;

a fourteenth switch coupled between the twelfth terminal and the fourth input terminal;

a fifteenth switch coupled between the ninth terminal and the first output node;

a sixteenth switch coupled between the eleventh terminal and the second output node;

a seventeenth switch coupled between the tenth terminal and the first output terminal; and an eighteenth switch coupled between the twelfth terminal and the second output terminal.

17. The MDAC of claim 16, wherein the MDAC operates according to a first clock, a second clock, and a third clock, when the first clock is at a first level and the second clock and the third clock are at a second level, the third switch, the fourth switch, the fifth switch, the sixth switch, the eleventh switch, and the twelfth switch are turned on, the thirteenth switch and the fourteenth switch are turned on, the seventh switch, the eighth switch, the ninth switch, the tenth switch, the first switch, and the second switch are turned on, and the fifteenth switch, the sixteenth switch, the seventeenth switch, and the eighteenth switch are turned off;

when the first clock is at the second level and the second clock is at the first level, the third switch, the fourth switch, the fifth switch, the sixth switch, the eleventh switch, and the twelfth switch are turned on, the thirteenth switch and the fourteenth switch are turned off, the seventh switch, the eighth switch, the ninth switch, the tenth switch, the first switch, and the second switch are turned on, and the fifteenth switch, the sixteenth switch, the seventeenth switch, and the eighteenth switch are turned on.

* * * * *